(12) United States Patent
Chang et al.

(10) Patent No.: US 7,371,661 B2
(45) Date of Patent: May 13, 2008

(54) WAFER BONDING METHOD

(75) Inventors: Chun-Hao Chang, Fengshan (TW); Shih-Chieh Liao, Taichung (TW); Guo-Shing Huang, Tainan (TW); Wei-Yu Chen, Luzhu Shiang (TW); Chuan-Sheng Zhuang, Da-an Shiang (TW)

(73) Assignee: Industrial Technology Research Institute, Hsinchu (TW)

( * ) Notice: Subject to any disclaimer, the term of this patent is extended or adjusted under 35 U.S.C. 154(b) by 176 days.

(21) Appl. No.: 11/432,632

(22) Filed: May 12, 2006

(65) Prior Publication Data
US 2007/0148911 A1   Jun. 28, 2007

(30) Foreign Application Priority Data
Dec. 28, 2005   (TW) .............................. 94146912 A

(51) Int. Cl.
*H01L 21/30* (2006.01)

(52) U.S. Cl. ............................. 438/455; 257/E21.518; 257/E21.519

(58) Field of Classification Search ................ 438/120, 438/455; 257/E21.499, E21.518, E21.519
See application file for complete search history.

(56) References Cited

U.S. PATENT DOCUMENTS 6,593,211 B2 *   7/2003   Sato ........................... 438/455

* cited by examiner

*Primary Examiner*—Scott B. Geyer
(74) *Attorney, Agent, or Firm*—Troxell Law Office, PLLC

(57) ABSTRACT

A wafer bonding method, comprising steps of: coating a medium layer respectively on the surfaces of two wafers; removing impurities formed on the surface of each medium layer; laminating the two wafers while enabling the surface coated with the medium layer of one of the two wafers to face the surface coated with the medium layer of another wafer; and applying an ultra-sonic oscillation and a bonding pressure upon the laminated wafers for bonding the two wafers.

20 Claims, 4 Drawing Sheets

| Parameter / Method | Temp. (°C) | Pressure (Bar) | Voltage (V) | Surface Roughness (nm) | Precise Gaps | Vacuum Level During Bonding (Torr) |
|---|---|---|---|---|---|---|
| Thermal Ultra-sonic Bonding | 100~200 | 1 | N/A | 100 | No | N/A |
| Anodic Bonding | 300~500 | N/A | 100~1000 | 20 | Yes | $10^{-5}$ |
| Glass Frit Bonding | 400~500 | 1 | N/A | N/A | No | 10 |
| Direct Bonding | 1000 | N/A | N/A | 0.5 | Yes | $10^{-3}$ |

FIG. 5

WAFER BONDING METHOD

BACKGROUND OF THE INVENTION

1. Field of the Invention

The present invention generally relates to a wafer bonding method and, more particularly, to a method using thermal ultra-sonic energy to activate a wafer surface and achieve direct bonding between wafers at low temperatures so as to save time and achieve environmental protection using such a lead-free process. The present invention is suitable for use in the GaN-based white light-emitting diode (LED) industry.

2. Description of the Prior Art

The purpose of the LED was mainly for an alert signal or advertisement. However, the LED has attracted more attention due to its possible use as a light source for the displays since the realization of the high power white LEDs.

The conventional white LED is realized using the blue GaN LED to emit blue light, and the blue light is then converted into white light by fluorescent powders. GaN is usually grown by hetero-epitaxy on, for example, a sapphire substrate because a large-area GaN substrate is still unavailable. However, the sapphire substrate has poor electrical conductivity and poor thermal conductivity. When the temperature of the LED is high enough to cause reduction in light-emitting efficiency, the poor thermal conductivity of the sapphire substrate limits the driving current for the LED. On the other hand, because of the poor electrical conductivity of the sapphire substrate, the electrode for the p-type and the electrode for the n-type are required to be formed on the same side of the substrate, which requires higher packaging cost and results in smaller transparent area. Also, the hard but fragile sapphire substrate is incompatible with conventional packaging processes. Therefore, the LED structure has to be mounted onto a substrate with excellent electrical conductivity and thermal conductivity using wafer bonding, and then the sapphire substrate is removed using laser left-off so to increase the light-emitting efficiency of the white GaN LED by up to 95%.

There have been reported several wafer bonding methods corresponding to different specifications, and the methods can be categorized into three divisions according to process temperatures and whether a medium layer is needed or not.

1. Anodic Bonding:

Please refer to FIG. 1, wherein the anode and cathode are coupled to a Si wafer 11 and a glass substrate 12 comprising ions, respectively. The anode is coupled to a high voltage supply 14 (up to 1,000V) through a wire 13 so as to generate a static electric field induced by the mobile ions in the glass substrate 12. A heater 15 is disposed under the substrate 12 to heat up to 400° C.~450° C. with an applied pressure 16 so as to achieve wafer bonding. However, this method is problematic that the process temperature is so high that different thermal expansion coefficients of the Si wafer 11 and the glass substrate 12 result in a great thermal stress during temperature lowering to cause undesirable bending and crack of the Si wafer 11. On the other hand, the glass substrate 12 has to be electrically conductive.

2. Glass Frit Bonding:

Please refer to FIG. 2A and FIG. 2B, wherein screen-printing 23 is used to provide a colloidal glass frit 22 with low melting point on a substrate 21. Pre-cure is used to remove the solvent in the colloidal glass frit 22, a pressure 26 (about 1 bar) is applied, and then the substrate 21 is baked at 400° C. to 450° C. so as to achieve wafer bonding. However, this method is problematic that process temperature is high, and the bonding quality is unsatisfactory.

3. Direct Bonding:

Direct bonding is the most adopted approach in the industry. It employs oxygen atoms to react with the Si atoms on the surface of a Si wafer to form Si—O—Si bonds that provide the required bonding. Requirements in surface roughness and cleanness for this method are very strict and therefore a specially designed clean room is necessary for the pressurizing and heating process. Thus, the method is problematic because of:

(1) high equipment cost;
(2) long time for bonding—the whole process including heating, pressurizing, and annealing takes as long as two hours;
(3) high temperature for bonding—the process takes place at 450° C.; and
(4) high temperature for annealing—the process takes place at 1000° C.;

Therefore, there exists a need in providing a wafer bonding method using thermal ultra-sonic energy to activate a wafer surface and achieve direct bonding between wafers at low temperatures (100° C. to 200° C.) so as to save time (within 20 seconds) and achieve environmental protection using such a lead-free process.

SUMMARY OF THE INVENTION

It is a primary object of the present invention to provide a wafer bonding method using thermal ultra-sonic energy to activate a wafer surface and achieve direct bonding between wafers at low temperatures (100° C. to 200° C.) so as to save time (within 20 seconds) and achieve environmental protection using such a lead-free process.

In order to achieve the foregoing object, the present invention provides a wafer bonding method, comprising steps of: coating a medium layer respectively on the surfaces of two wafers; removing impurities formed on the surface of each medium layer; laminating the two wafers while enabling the surface coated with the medium layer of one of the two wafers to face the surface coated with the medium layer of another wafer; and applying an ultra-sonic oscillation and a bonding pressure upon the laminated wafers for bonding the two wafers.

Preferably, the wafers comprise compound, semiconductor or metal.

Preferably, the medium layer is able to provide a molecular bonding force by ultra-sonic oscillation to activate the surface molecules.

Preferably, the medium layer comprises metal or polymer.

Preferably, the impurities are removed using gas, liquid or high-energy particles.

Preferably, the ultra-sonic oscillation is generated using a frequency oscillation generator.

Preferably, the frequency oscillation generator is an oscillator or an energy amplifier.

Preferably, the ultra-sonic oscillation is arbitrarily oriented.

BRIEF DESCRIPTION OF THE DRAWINGS

The objects, spirits and advantages of the preferred embodiment of the present invention will be readily understood by the accompanying drawings and detailed descriptions, wherein:

FIG. 5 is a table showing comparison between parameters used in the conventional method and the method of the present invention.

DETAILED DESCRIPTION OF THE PREFERRED EMBODIMENT

The present invention providing a wafer bonding method can be exemplified by the preferred embodiments as described hereinafter.

Figure 1:
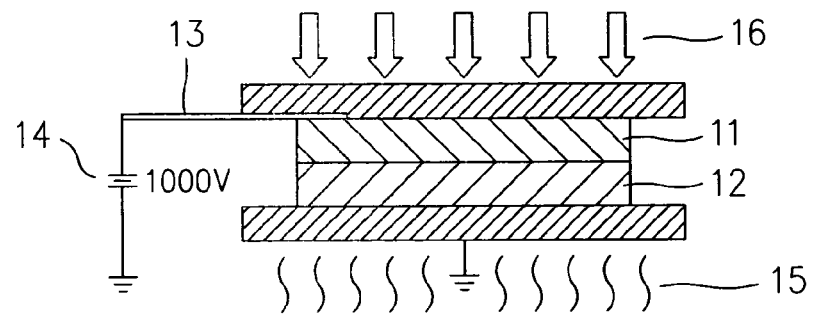
FIG. 1 is a cross-sectional view showing a conventional anodic wafer bonding method.
Figure 2A:
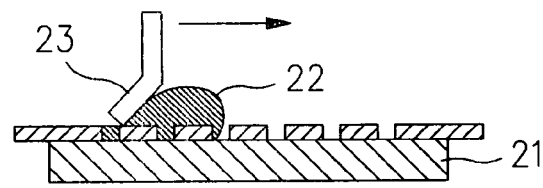
FIG. 2A and FIG. 2B are cross-sectional views showing a conventional glass frit bonding method.
Figure 2B:
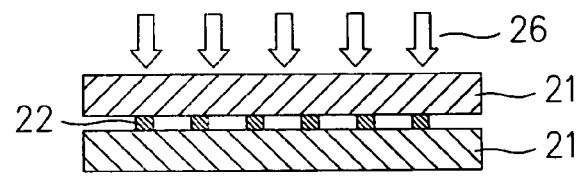
Figure 3A:
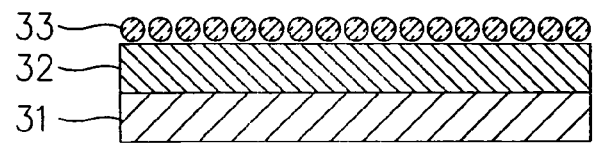
FIG. 3A to FIG. 3D are cross-sectional views showing a wafer bonding method according to the present invention.
Figure 3B:
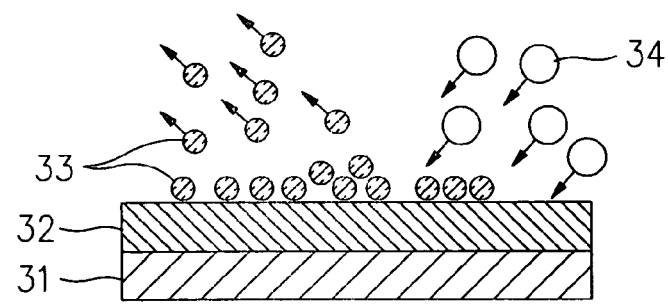
Figure 4:
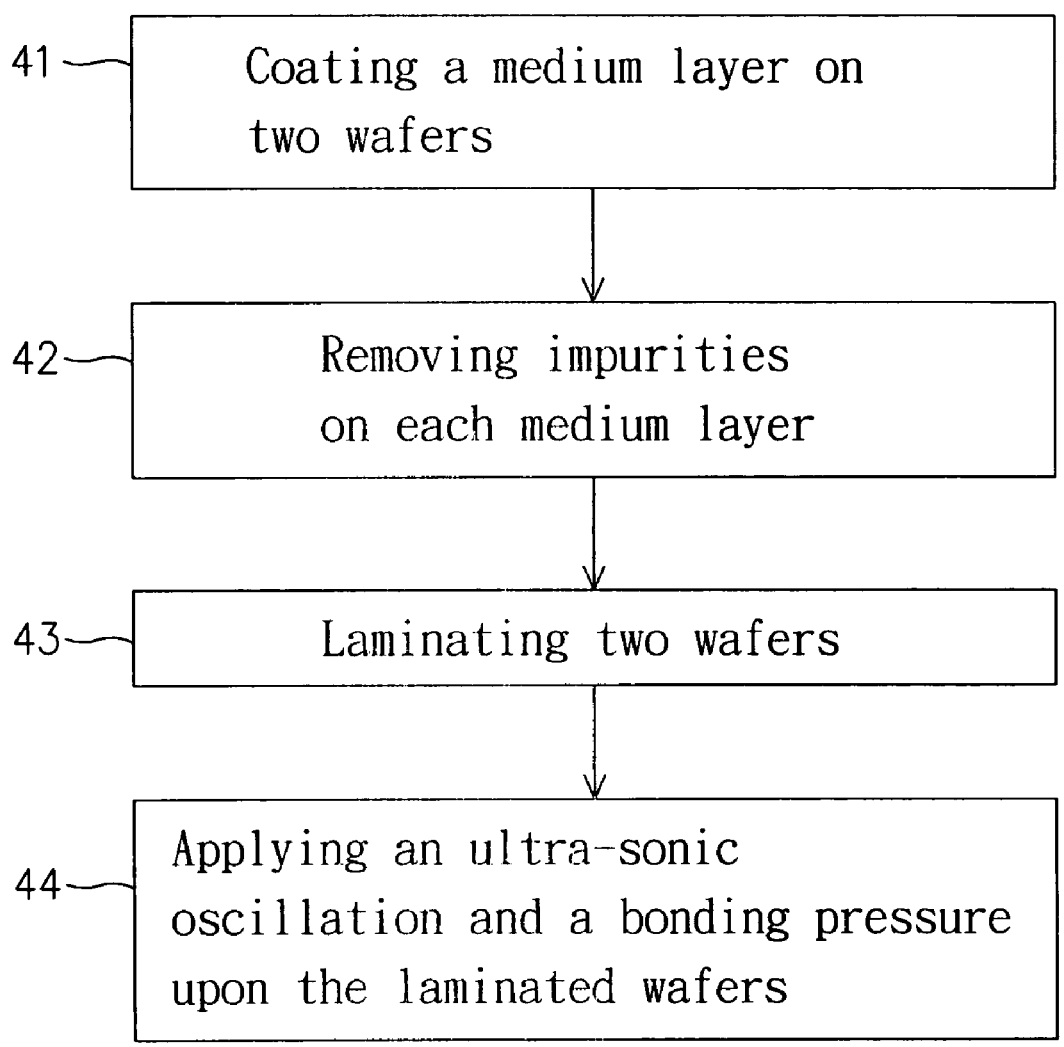
FIG. 4 is a flow chart of the present invention.

Please refer to FIG. 3A to FIG. 3B and FIG. 4. With reference to the drawings, the wafer bonding method comprises steps as followed:

In Step 41, a medium layer 32 is coated respectively on the surfaces of two wafers 31, wherein each wafer is as shown in FIG. 3A. In the present embodiment, the wafers 31 comprise compound, semiconductor or metal; and the medium layer 32 comprises metal or polymer. However, the present is not limited thereto, and those with ordinary skills in the art can make modifications within the scope of the present invention. For example, any material being able to provide a molecular bonding force by ultra-sonic oscillation to activate the surface molecules can be used as the medium layer 32.

As shown in FIG. 3B, impurities usually exist on the surface of medium layer 32 once the surface of medium layer 32 is exposed in the ambient. The impurities are oxide formed on the surface of medium layer 32 or external contaminants 33. The impurities would adversely affect the bonding process if they were not removed. Therefore, in Step 42, the impurities 33 formed on the surface of each medium layer 32 are removed. In the present embodiment, the impurities 33 are removed using gas or liquid 34. For example, the gas can be nitrogen and the liquid can be de-ionized water or a chemical solution. Alternatively, the impurities 33 are removed using high-energy particles 34 in a form of plasma, as shown in FIG. 3B.

Figure 3C:
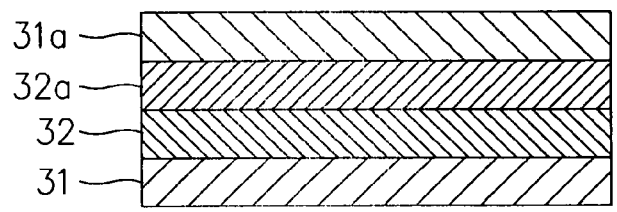

Then, in Step 43, the two wafers 31 and 31a are laminated, while enabling the surface coated with the medium layer 32 of one wafer 31 to face the surface coated with the medium layer 32a of another wafer 31a, as shown in FIG. 3C.

Figure 3D:
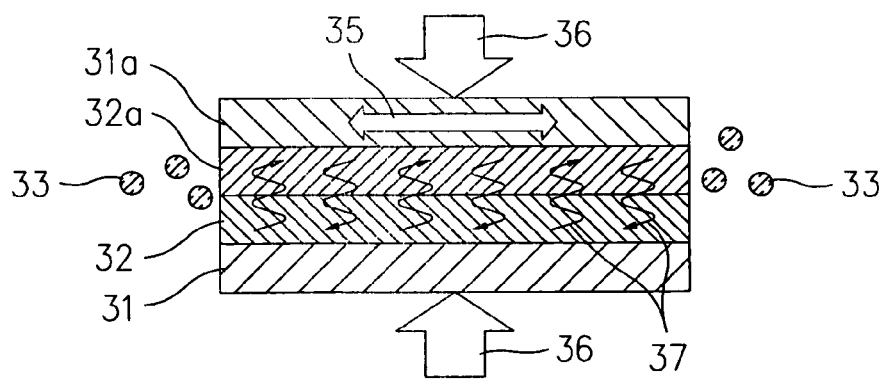

Finally, in Step 44, an ultra-sonic oscillation 35 and a bonding pressure 36 are applied upon the laminated wafers 31 and 31a so as to activate the surface molecules 37 for wafer bonding, as shown in FIG. 3D. In the present embodiment, the ultra-sonic oscillation 35 is generated using a frequency oscillation generator (not shown), such as an oscillator or an energy amplifier. Preferably, the ultra-sonic oscillation 35 is arbitrarily oriented. After the medium layers 32 and 32a of the wafers 31 and 31a are treated with the ultra-sonic oscillation 35, the surface molecules 37 are activated and relatively move at a high frequency so as to prevent the interface of the medium layers 32 and 32a from being adhered to by the impurities 33 or to remove the impurities 33 already formed. Thereby, the molecular bonding is formed between the medium layers 32 and 32a so as to achieve wafer bonding between the two wafers 31 and 31a.

To sum up, FIG. 5 is a table showing comparison between parameters used in the conventional method and the method of the present invention. According to the above discussion, it is apparent that the present invention discloses a wafer bonding method using thermal ultra-sonic energy to activate a wafer surface and achieve direct bonding between wafers at low temperatures (100° C. to 200° C.) so as to save time (less than 20 seconds) and achieve environmental protection using such a lead-free process. Therefore, the present invention is novel, useful and non-obvious.

Although this invention has been disclosed and illustrated with reference to particular embodiments the principles involved are susceptible for use in numerous other embodiments that will be apparent to persons skilled in the art. This invention is, therefore, to be limited only as indicated by the scope of the appended claims.

What is claimed is:

1. A wafer bonding method, comprising steps of:
   coating a medium layer respectively on the surfaces of two wafers;
   removing impurities formed on the surface of each medium layer;
   laminating the two wafers while enabling the surface coated with the medium layer of one of the two wafers to face the surface coated with the medium layer of another wafer; and
   applying an ultra-sonic oscillation and a bonding pressure upon the laminated wafers for bonding the two wafers.

2. The wafer bonding method as recited in claim 1, wherein the wafers comprise compound.

3. The wafer bonding method as recited in claim 1, wherein the wafers comprise semiconductor.

4. The wafer bonding method as recited in claim 1, wherein the wafers comprise metal.

5. The wafer bonding method as recited in claim 1, wherein the medium layer is able to provide a molecular bonding force by ultra-sonic oscillation to activate the surface molecules.

6. The wafer bonding method as recited in claim 5, wherein the medium layer comprises metal or polymer.

7. The wafer bonding method as recited in claim 5, wherein the medium layer comprises polymer.

8. The wafer bonding method as recited in claim 1, wherein the impurities are removed using gas, liquid or plasma.

9. The wafer bonding method as recited in claim 8, wherein the gas is nitrogen.

10. The wafer bonding method as recited in claim 1, wherein the impurities are removed using liquid.

11. The wafer bonding method as recited in claim 10, wherein the liquid is de-ionized water or a chemical solution.

12. The wafer bonding method as recited in claim 1, wherein the impurities are removed using high-energy particles.

13. The wafer bonding method as recited in claim 12, wherein the high-energy particles are in a form of plasma.

14. The wafer bonding method as recited in claim 1, wherein the impurities are oxide formed on the surface of each medium layer.

15. The wafer bonding method as recited in claim 1, wherein the impurities are external contaminants.

16. The wafer bonding method as recited in claim 1, wherein the ultra-sonic oscillation is generated using a frequency oscillation generator.

17. The wafer bonding method as recited in claim 16, wherein the frequency oscillation generator is an oscillator.

18. The wafer bonding method as recited in claim 16, wherein the frequency oscillation generator is energy amplifier.

19. The wafer bonding method as recited in claim 1, wherein the ultra-sonic oscillation is arbitrarily oriented.

20. The wafer bonding method as recited in claim 1, wherein the applying step takes place at a temperature raging from 100° C. to 200° C.

* * * * *